United States Patent
Song et al.

(10) Patent No.: US 9,076,696 B2
(45) Date of Patent: Jul. 7, 2015

(54) METHOD OF MANUFACTURING FLEXIBLE DISPLAY

(75) Inventors: Taejoon Song, Paju-si (KR); Soonsung Yoo, Goyang-si (KR)

(73) Assignee: LG DIPLAY CO., LTD., Seoul (KR)

( * ) Notice: Subject to any disclaimer, the term of this patent is extended or adjusted under 35 U.S.C. 154(b) by 0 days.

(21) Appl. No.: 13/339,202

(22) Filed: Dec. 28, 2011

(65) Prior Publication Data
US 2013/0005059 A1 Jan. 3, 2013

(30) Foreign Application Priority Data
Jun. 28, 2011 (KR) .................... 10-2011-0062820

(51) Int. Cl.
| | |
|---|---|
| H01L 21/00 | (2006.01) |
| H01L 27/12 | (2006.01) |
| H01L 21/683 | (2006.01) |
| H01L 29/786 | (2006.01) |

(52) U.S. Cl.
CPC ........ H01L 27/1266 (2013.01); H01L 21/6835 (2013.01); H01L 27/1214 (2013.01); H01L 27/12 (2013.01); H01L 29/78603 (2013.01)

(58) Field of Classification Search
CPC . H01L 27/1266; H01L 27/1214; H01L 27/12; H01L 29/78603; H01L 21/6835
USPC ........... 438/28, 26, 30, 149, 99; 257/E21.499
See application file for complete search history.

(56) References Cited

U.S. PATENT DOCUMENTS

| | | | |
|---|---|---|---|
| 6,814,832 B2 * | 11/2004 | Utsunomiya | 156/230 |
| 7,713,836 B2 * | 5/2010 | Aoki et al. | 438/455 |
| 7,820,529 B2 * | 10/2010 | Tsurume et al. | 438/464 |
| 7,825,002 B2 * | 11/2010 | Takayama et al. | 438/406 |
| 2006/0055314 A1 * | 3/2006 | Nakamura et al. | 313/500 |
| 2009/0029527 A1 * | 1/2009 | Amundson et al. | 438/464 |

* cited by examiner

*Primary Examiner* — Michael Trinh
(74) *Attorney, Agent, or Firm* — Birch, Stewart, Kolasch & Birch, LLP

(57) ABSTRACT

Provided is a method of manufacturing a flexible display, which can simplify manufacturing processes and reduce manufacturing expenses. A method of manufacturing a flexible display according to one exemplary embodiment of the present invention may include: forming a sacrificial layer on a carrier substrate; forming a flexible substrate on the sacrificial layer; forming a TFT array on the flexible substrate; etching the sacrificial layer to separate the flexible substrate from the carrier substrate; attaching the flexible substrate to an adhesive roll; and attaching the flexible substrate, which has been attached to the adhesive roll, to a rear substrate.

8 Claims, 10 Drawing Sheets

RELATED ART

METHOD OF MANUFACTURING FLEXIBLE DISPLAY

This application claims the benefit of Korean Patent Application No. 10-2011-0062820 filed on Jun. 28, 2011, which is hereby incorporated by reference.

BACKGROUND

1. Field

This document relates to a method of manufacturing a flexible display, and, more particularly, to a method of manufacturing a flexible display, which enables a carrier substrate to be recycled.

2. Related Art

Nowadays, display devices acquire greater importance with the development of multimedia. At the same time, a variety of flat-panel displays, such as an LCD (Liquid Crystal Display), a PDP (Plasma Display Panel), an FED (Field Emission Display), an OLED (Organic Light Emitting Diode Display Device), an EPD (Electrophoretic Display) etc., are being put into practical use.

Recently, a flexible display has been developed that is made of a flexible material, such as plastic, etc., instead of a general non-flexible glass substrate, so that it can maintain a display performance even when bent like paper. However, the substrate of the flexible display is so easily bent that it should be supported on a hard substrate such as a carrier substrate during the manufacture.

FIG. 1 is a flowchart showing sequential steps of a method of manufacturing a conventional flexible display.

Referring to FIG. 1, so as to manufacture the conventional flexible display, a sacrificial layer is formed on a carrier substrate, and then a flexible substrate is formed on the sacrificial layer (S10). A TFT array is formed on the flexible substrate (S20), a display device is attached thereto, and then the flexible substrate is scribed in cell units (S30). Next, the cell-unit flexible display comprised of the flexible substrate and the display device is sealed up (S40), and then the flexible substrate is separated from the carrier substrate (S50). Thus, the manufacture of the flexible display is finished.

However, in the conventional flexible display, since the scribing process is carried out in a state where the carrier substrate and the flexible substrate are attached to each other, once the carrier substrate is used, it should be thrown away. Accordingly, there is a problem in that the costs increase because the carrier substrate is not recyclable.

SUMMARY

An aspect of this document is to provide a method of manufacturing a flexible display, which can simplify manufacturing processes and reduce manufacturing expenses.

A method of manufacturing a flexible display according to one exemplary embodiment of the present invention may include: forming a sacrificial layer on a carrier substrate; forming a flexible substrate on the sacrificial layer; forming a TFT array on the flexible substrate; etching the sacrificial layer to separate the flexible substrate from the carrier substrate; attaching the flexible substrate to an adhesive roll; and attaching the flexible substrate, which has been attached to the adhesive roll, to a rear substrate.

A method of manufacturing a flexible display according to another exemplary embodiment of the present invention may include: forming a sacrificial layer on a carrier substrate; forming a buffer layer on the sacrificial layer; forming a TFT array on the buffer layer; etching the sacrificial layer to separate the buffer layer, which has the TFT array formed thereon, from the carrier substrate; attaching the buffer layer, which has the TFT array formed thereon, to an adhesive roll; and attaching the buffer layer, which has the TFT array formed thereon and which has been attached to the adhesive roll, to a rear substrate.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION

Reference will now be made in detail embodiments of the invention examples of which are illustrated in the accompanying drawings.

Figure 1:
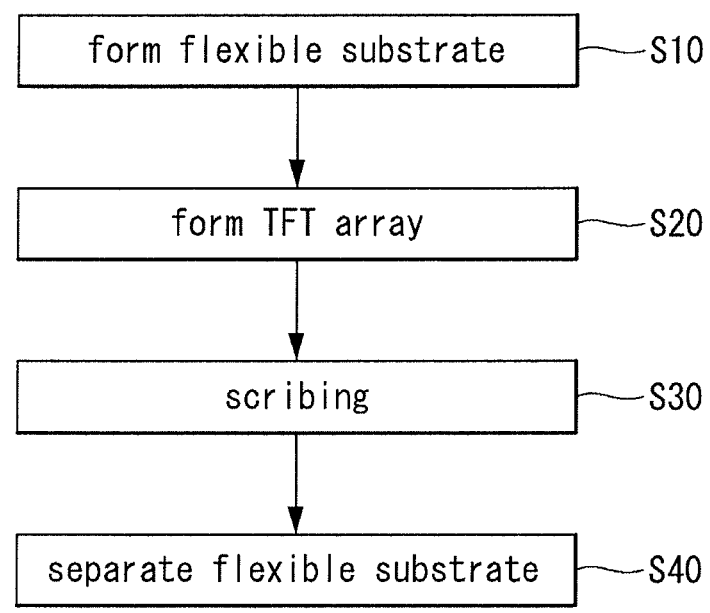
FIG. 1 is a flowchart showing sequential steps of a method of manufacturing a conventional flexible display.
Figure 2:
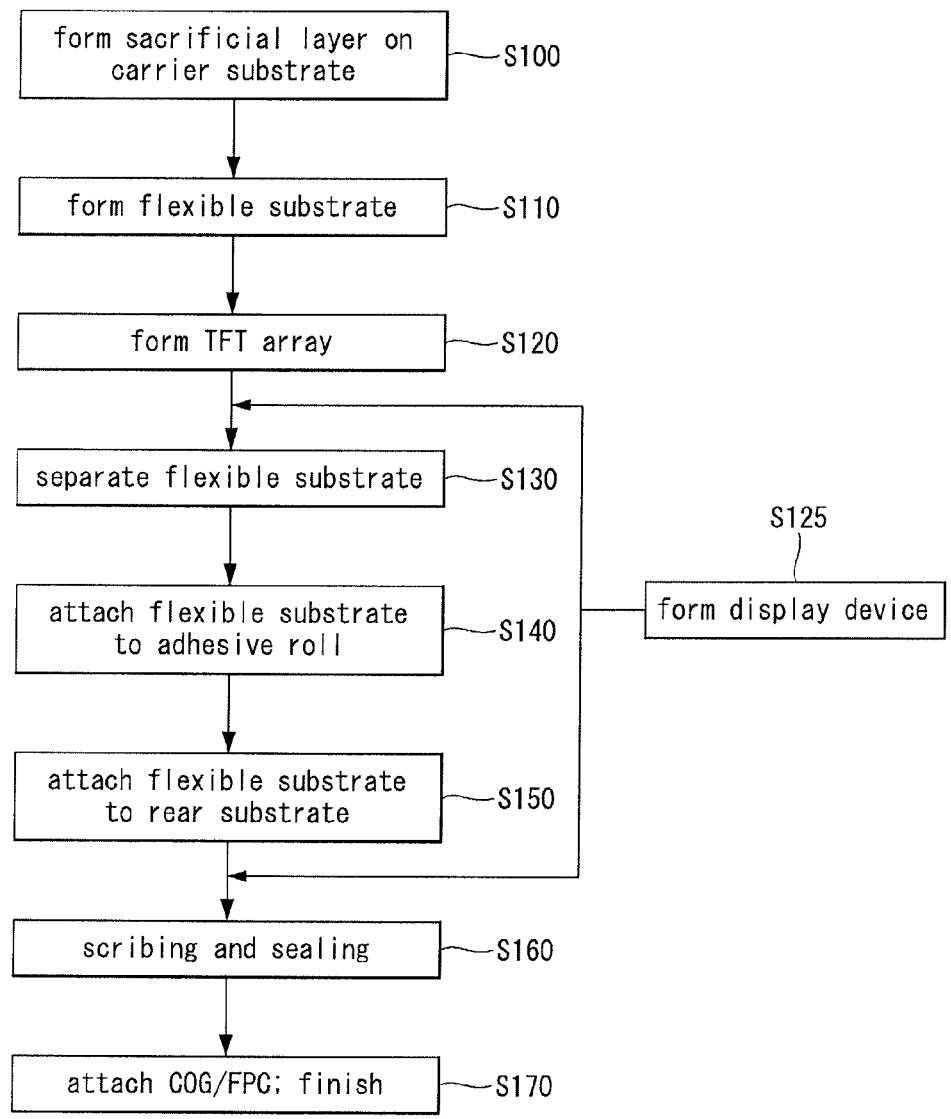
FIG. 2 is a flowchart showing sequential steps of a method of manufacturing a flexible display according to a first embodiment of the present invention.

FIG. 2 is a flowchart showing sequential steps of a method of manufacturing a flexible display according to a first embodiment of the present invention.

Referring to FIG. 2, the method of manufacturing the flexible display according to the first embodiment of the present invention includes a process (S100) of forming a sacrificial layer on a carrier substrate, a process (S110) of forming a flexible substrate, a process (S120) of forming a TFT array, a process (S130) of separating the flexible substrate, a process (S140) of attaching the flexible substrate to an adhesive roll, a process (S150) of attaching the flexible substrate to a rear substrate, a scribing and sealing process (S160), and a process (S170) of attaching a COG/FPC.

In more detail, the process (S100) of forming the sacrificial layer on the carrier substrate is a process of forming the sacrificial layer on the carrier substrate which is hard and resistant to high temperature, such as glass. The process (S110) of forming the flexible substrate is a process of forming the flexible substrate by coating polyimide on the entire surface of the sacrificial layer, and the process (S120) of forming the TFT array is a process of forming the TFT array on the flexible substrate. A process (S125) of forming a display device is a process of forming the display device on the TFT array, which can be performed after the process of forming the TFT array or before the scribing and sealing process.

And, the process (S130) of separating the flexible substrate is a process of separating the flexible substrate from the carrier substrate, and the process (S140) of attaching the flexible substrate to the adhesive roll is a process of winding the separated flexible substrate around the adhesive roll to be attached thereto. The process (S150) of attaching the flexible substrate to the rear substrate is a process of attaching the flexible substrate, which has been attached to the adhesive roll, to the rear substrate by rolling the adhesive roll, and the scribing and sealing process (S160) is a process of cutting the flexible substrate in cell units and sealing the same. Finally, the process (S170) of attaching the COG/FPC is a process of attaching the COG/FPC to thereby finish the manufacture of the flexible display.

Figure 3A:
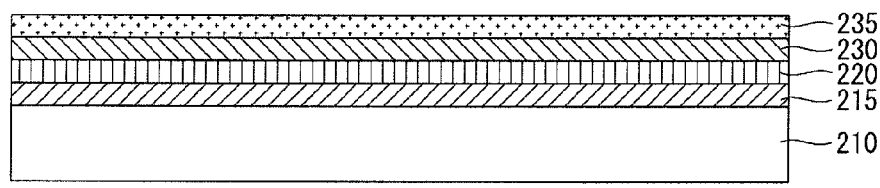
FIG. 3a to FIG. 3f are views showing sequential steps of the method of manufacturing the flexible display according to the first embodiment of the present invention.
Figure 3B:
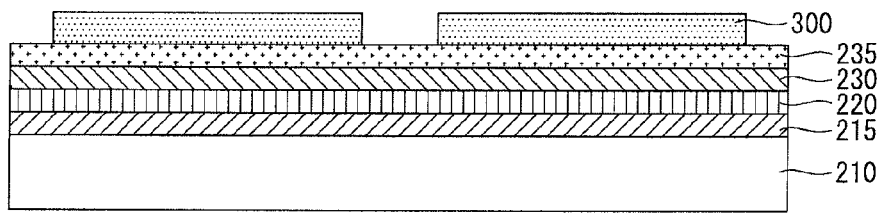
Figure 3C:
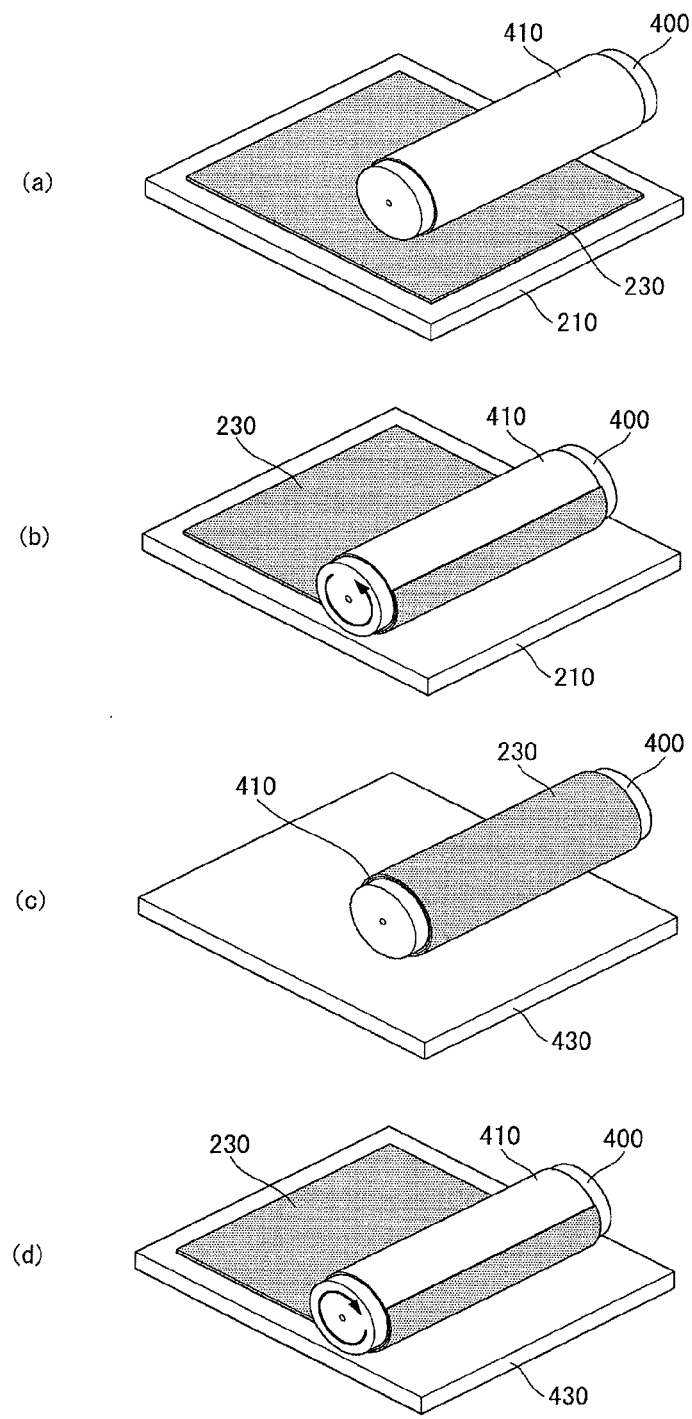
Figure 3D:
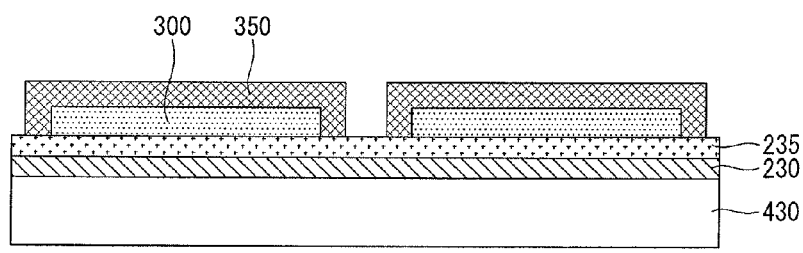
Figure 3E:
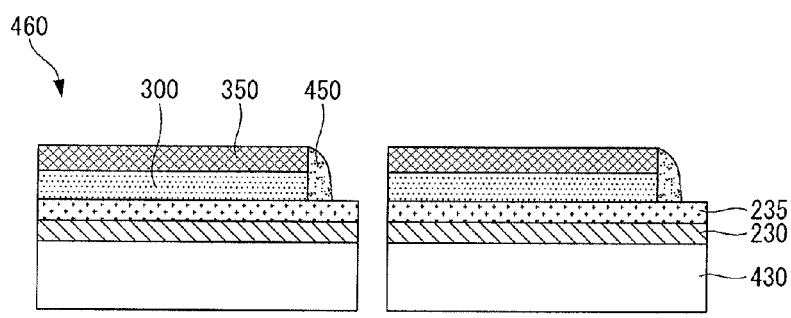
Figure 3F:
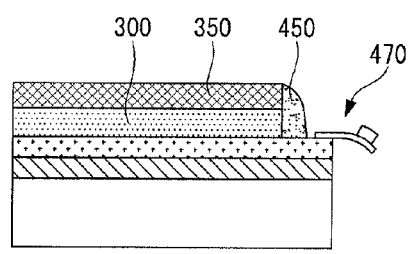
Figure 4:
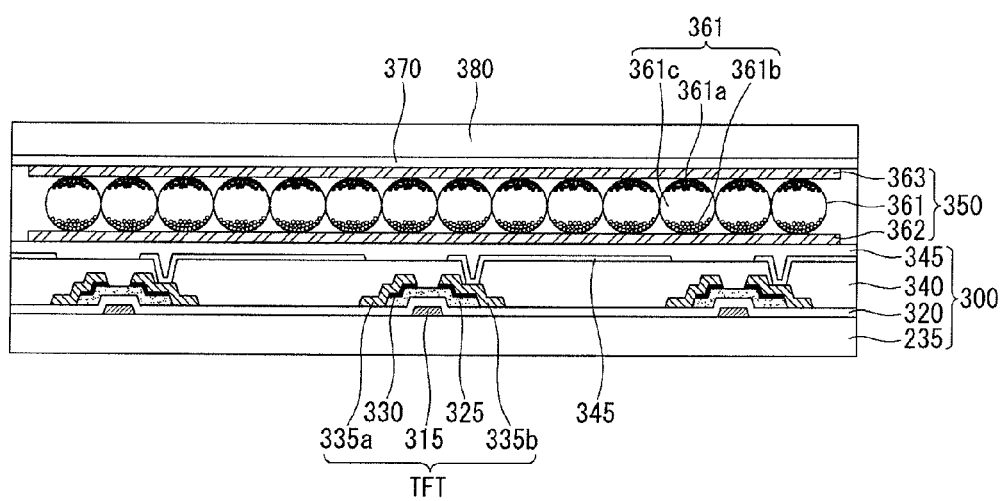
FIG. 4 is a view showing a TFT array and an electrophoretic film.

FIG. 3a to FIG. 3f are views showing sequential steps of the method of manufacturing the flexible display according to the first embodiment of the present invention, and FIG. 4 is a view showing a TFT array and an electrophoretic film.

Referring to FIG. 3a, an inorganic insulating film 215 is formed on a carrier substrate 210 made of glass. The inorganic insulating film 215, which is made of silicon nitride, serves to improve the adhesion property to a sacrificial layer formed in the succeeding step. And, amorphous silicon is deposited on the inorganic insulating film 215 to form a sacrificial layer 220.

Next, polyimide, which is a polymer material, is spin-coated on the entire surface of the sacrificial layer 220. Then, the coated polyimide is hardened to form a flexible substrate 230. Thereafter, a buffer layer 235 is formed on the flexible substrate 230. The buffer layer 235 serves to improve the bonding property to the flexible substrate 230 made of a polymer material and also serves to prevent discharge of organic gas or organic fine particles, which may occur when the polymer material is exposed to high temperature.

Next, referring to FIG. 3b, a TFT array 300 is formed on the buffer layer 235. It will be described in more detail with reference to FIG. 4 which illustrates the TFT array 300. Metal is stacked on the buffer layer 235 to form a gate electrode 315, and silicon oxide or silicon nitride is stacked on the gate electrode 315 to form a gate insulating film 320 for insulation of the gate electrode 315.

Then, amorphous silicon or polycrystalline silicon containing crystallized amorphous silicon is provided and patterned on the gate insulating film 320, to thereby form a semiconductor layer 325 corresponding to the gate electrode 315. And, an ohmic contact layer 330 is formed on either side of the semiconductor layer 325, and metal of low resistance is stacked and patterned thereon, to thereby form a source electrode 335a and a drain electrode 335b connected to the ohmic contact layer 330. Thus, the manufacture of the TFT is finished.

Thereafter, a planarization film 340 is provided that protects the TFT, and a first electrode 345 is provided that is connected to the drain electrode 335b via a contact hole of the planarization film 340, thus obtaining the TFT array 300.

Next, referring to (a) of FIG. 3c, the flexible substrate 230, which has the TFT array 300 formed thereon, is separated from the carrier substrate 210. Here, when a laser is irradiated to the sacrificial layer 220 between the carrier substrate 210 and the flexible substrate 230, the sacrificial layer 220 generates a hydrogen gas, which separates the flexible substrate 230 from the carrier substrate 210.

When the flexible substrate 230 is separated from the carrier substrate 210, an adhesive roll 400 is brought into contact with the flexible substrate 230 and rolled thereon. As a result, as shown in (b) of FIG. 3c, the flexible substrate 230 is wound around the adhesive roll 400 to be attached thereto. Here, the adhesive roll 400 has an adhesive 410, such as polydimethylsiloxane, coated thereon, so that the flexible substrate 230 can be attached to the adhesive roll 400.

Then, referring to (c) and (d) of FIG. 3c, a rear substrate 430 coated with an adhesive is placed under the adhesive roll 400, and the adhesive roll 400 is brought into contact with the rear substrate 430 and rolled thereon, so that the flexible substrate 230 is attached to the rear substrate 430. Accordingly, the flexible substrate 230 is separated from the carrier substrate 210 and attached to the rear substrate 430, while the carrier substrate 210 is used again in the process of manufacturing the flexible substrate.

Next, referring to FIG. 3d, a display device 350 is formed on the TFT array 300. Exemplary display devices 350 of the present invention may include an OLED (Organic Light Emitting Diode Display Device), an LCD (Liquid Crystal Display), an EPD (Electrophoretic Display), a PDP (Plasma Display Panel), etc. The EPD is taken as an example in this exemplary embodiment.

In more detail, referring to FIG. 4, a passivation film 345 is formed on the TFT array 300, and an electrophoretic film 350, which is an electrophoretic display device, is attached to the passivation film 345. The electrophoretic film 350 is comprised of capsules 361, which contain charge pigment particles, and upper and lower protecting layers 363 and 362 positioned on/under the capsules 361. The capsule 361 contains black pigment particles 361a which react to a positive voltage, white pigment particles 361b which react to a negative voltage, and a solvent 361c. The upper and lower protecting layers 363 and 362 serve to prevent the movement of the spherical capsules 361, while protecting them. These upper and lower protecting layers 363 and 362 are made of a plastic or a conductive material having flexibility. And, a protecting film 380, which has a second electrode 370 formed thereon, is provided on the electrophoretic film 350.

Thereafter, referring to FIG. 3e, a flexible display 460, which has the electrophoretic film 350 attached thereto, is scribed in cell units using a cutter or a laser cutter. And, for sealing, a sealant 450 is coated on the periphery of the flexible display 460 of each cell unit. Next, referring to FIG. 3f, a COG/FPC 470 is attached to the flexible display 460. Thus, the manufacture of the flexible display 460 according to the first embodiment of the present invention is finished.

As described above, the method of manufacturing the flexible display according to the first embodiment of the present invention has an advantage in that manufacturing expenses can be reduced due to recycling of the carrier substrate since it is separated from the flexible substrate prior to the scribing process. In addition, this method has an advantage in that manufacturing processes can be simplified since the flexible substrate is attached to the rear substrate in a simple manner using the adhesive roll, which results in high productivity.

Meanwhile, unlike the first embodiment described above, according to the present invention, the flexible display can be manufactured without the process of forming the flexible substrate.

Figure 5:
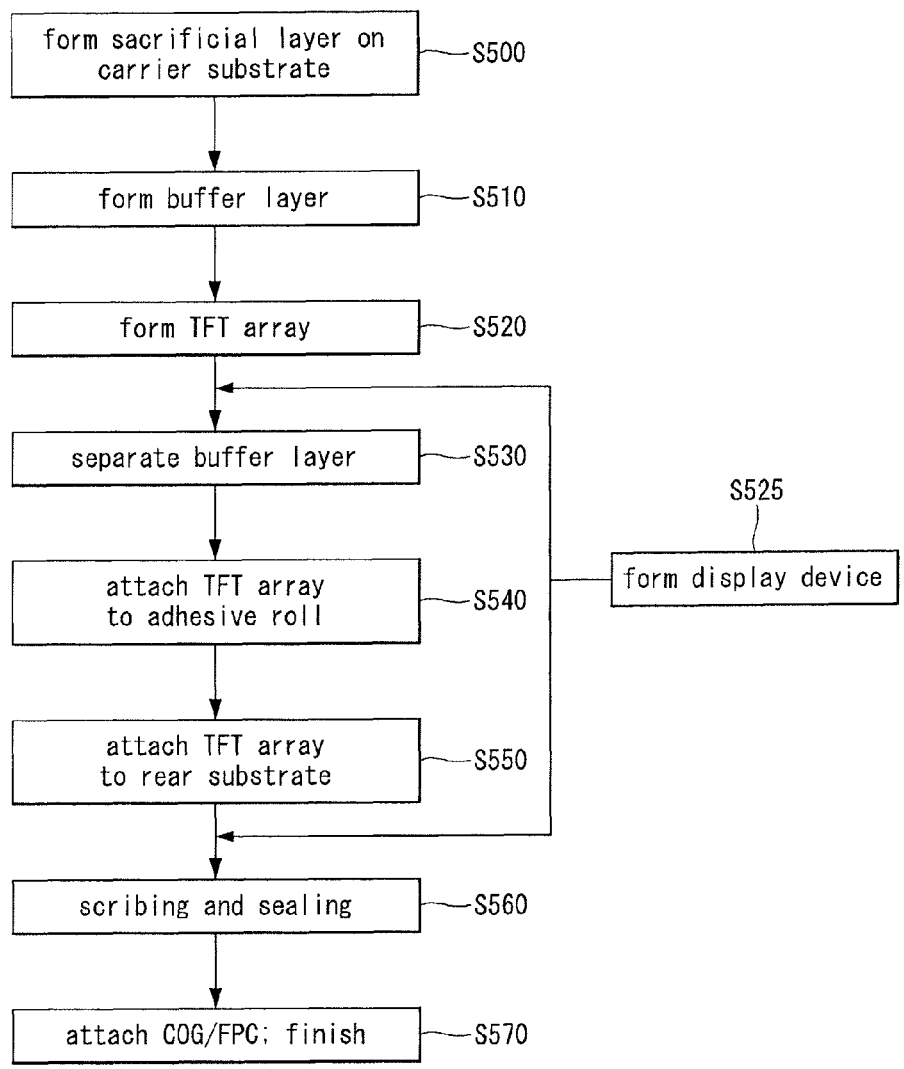
FIG. 5 is a flowchart showing sequential steps of a method of manufacturing a flexible display according to a second embodiment of the present invention.

FIG. 5 is a flowchart showing sequential steps of a method of manufacturing a flexible display according to a second embodiment of the present invention.

The method of manufacturing the flexible display according to the second embodiment of the present invention includes a process (S500) of forming a sacrificial layer on a carrier substrate, a process (S510) of forming a buffer layer, a process (S520) of forming a TFT array, a process (S530) of separating the buffer layer, a process (S540) of attaching the TFT array to an adhesive roll, a process (S550) of attaching the TFT array to a rear substrate, a scribing and sealing process (S560), and a process (S570) of attaching a COG/FPC.

In more detail, the process (S500) of forming the sacrificial layer on the carrier substrate is a process of forming the sacrificial layer on the carrier substrate which is hard and resistant to high temperature, such as glass. The process (S510) of forming the buffer layer is a process of forming the buffer layer on the sacrificial layer using silicon oxide or silicon nitride, and the process (S520) of forming the TFT array is a process of forming the TFT array on the buffer layer. A process (S525) of forming a display device is a process of forming the display device on the TFT array, which can be performed after the process of forming the TFT array or before the scribing and sealing process.

And, the process (S530) of separating the buffer layer is a process of separating the buffer layer from the carrier substrate, and the process (S540) of attaching the TFT array to the adhesive roll is a process of winding the buffer layer, which has the TFT array formed thereon, around the adhesive roll to be attached thereto. The process (S550) of attaching the TFT array to the rear substrate is a process of attaching the buffer layer to the rear substrate by rolling the adhesive roll, and the scribing and sealing process (S560) is a process of cutting the flexible substrate in cell units and sealing the same. Finally, the process (S570) of attaching the COG/FPC is a process of attaching the COG/FPC to thereby finish the manufacture of the flexible display.

FIG. 6a to FIG. 6f are views showing sequential steps of the method of manufacturing the flexible display according to the second embodiment of the present invention. Same processes as those of the first embodiment described above will be briefly described.

Figure 6A:
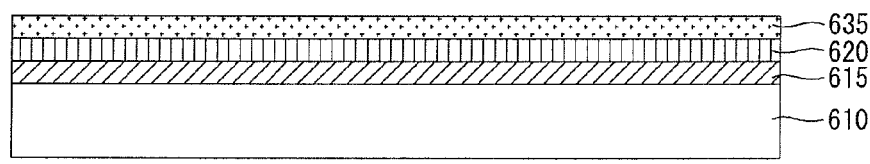
FIG. 6a to FIG. 6f are views showing sequential steps of the method of manufacturing the flexible display according to the second embodiment of the present invention.

Referring to FIG. 6a, an inorganic insulating film 615 is formed on a carrier substrate 610 made of glass, and amorphous silicon is deposited on the inorganic insulating film 615 to form a sacrificial layer 620. Thereafter, a buffer layer 635 is formed on the sacrificial layer 620. The buffer layer 635 serves to support the TFT array formed thereon, when it is separated from the carrier substrate 610.

Figure 6B:
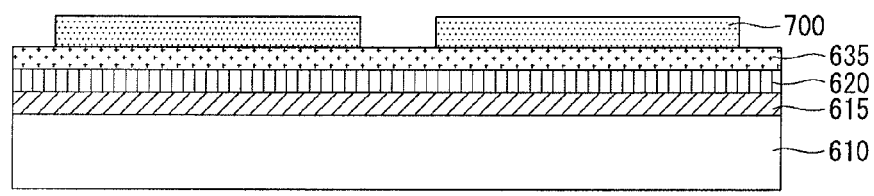

Next, referring to FIG. 6b, a TFT array 700 is formed on the buffer layer 635. The TFT array 700 is the same as the one described in the first embodiment, and thus a description thereof is omitted.

Figure 6C:
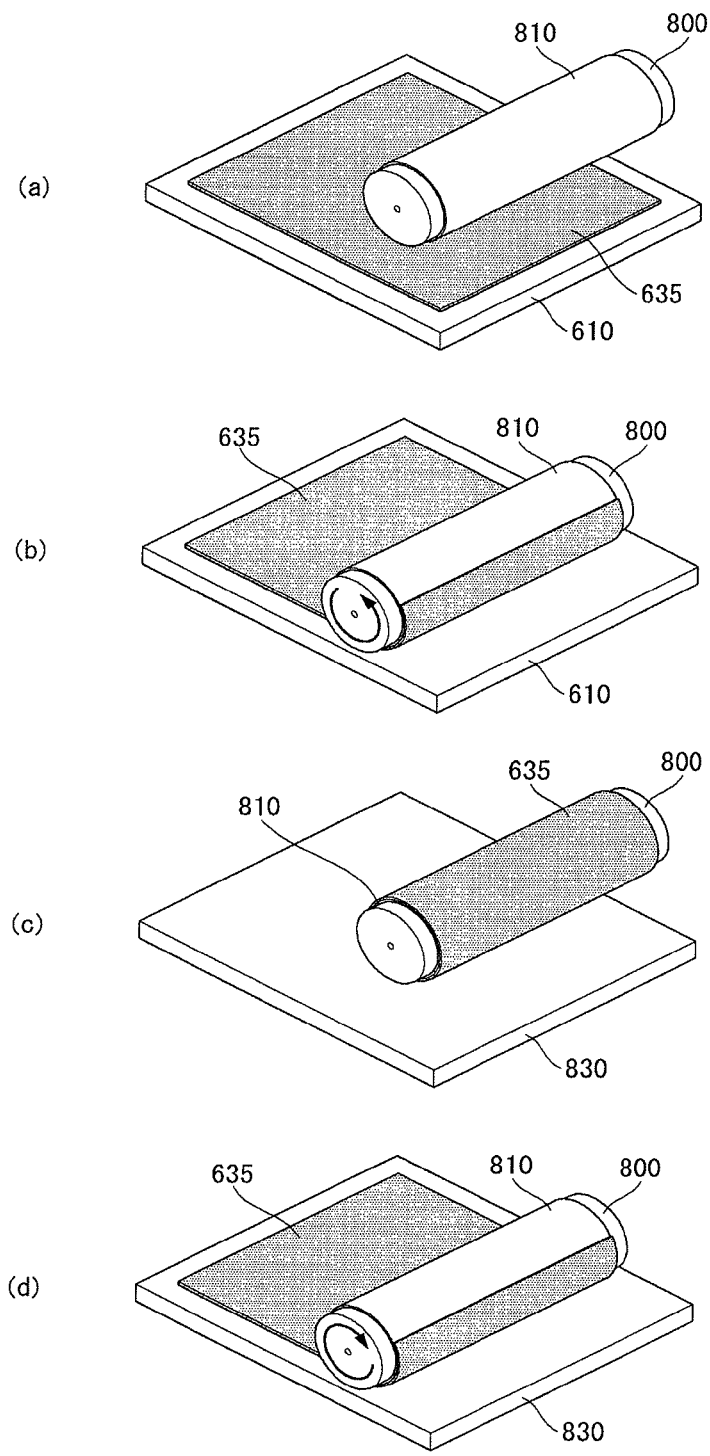

Next, referring to (a) of FIG. 6c, the buffer layer 635, which has the TFT array 700 formed thereon, is separated from the carrier substrate 610. Here, when a laser is irradiated to the sacrificial layer 620 between the carrier substrate 610 and the buffer layer 635, the sacrificial layer 620 generates a hydrogen gas, which separates the buffer layer 635 from the carrier substrate 610. When the buffer layer 635 is separated from the carrier substrate 610, an adhesive roll 800 is brought into contact with the buffer layer 635, which has the TFT array 700 formed thereon, and rolled on the buffer layer 635. As a result, as shown in (b) of FIG. 6c, the buffer layer 635 is wound around the adhesive roll 800 to be attached thereto.

Then, referring to (c) and (d) of FIG. 6c, a rear substrate 830 coated with an adhesive is placed under the adhesive roll 800, and the adhesive roll 800 is brought into contact with the rear substrate 830 and rolled thereon, so that the buffer layer 635 is attached to the rear substrate 830. Accordingly, the buffer layer 635 is separated from the carrier substrate 610 and attached to the rear substrate 630, while the carrier substrate 610 is used again in the process of manufacturing the flexible substrate.

Figure 6D:
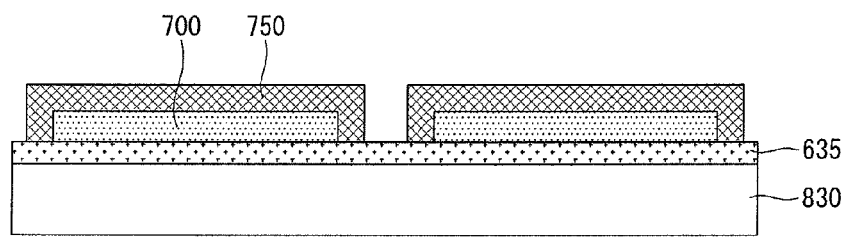
Figure 6E:
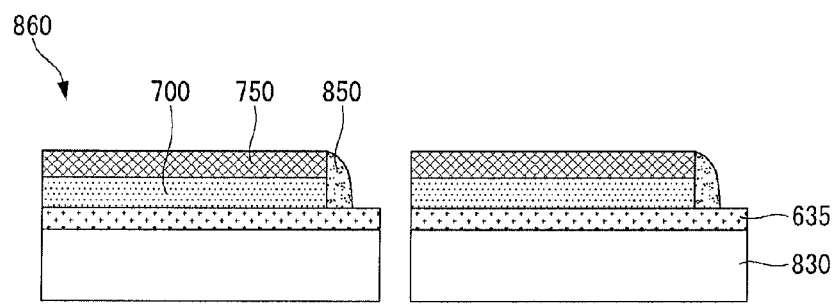
Figure 6F:
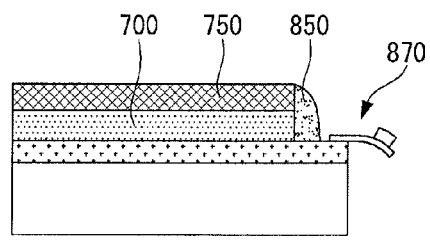

Next, referring to FIG. 6d, a display device 750 is formed on the TFT array 700. As in the first embodiment, an electrophoretic film which is a electrophoretic display device is taken as an example of the display device 750 of the present invention. Thereafter, referring to FIG. 6e, a flexible display 860, which has the electrophoretic film 750 attached thereto, is scribed in cell units using a cutter or a laser cutter. And, for sealing, a sealant 850 is coated on the periphery of the flexible display 860 of each cell unit. Next, referring to FIG. 6f, a COG/FPC 870 is attached to the flexible display 860. Thus, the manufacture of the flexible display 860 according to the second embodiment of the present invention is finished.

As described above, the method of manufacturing the flexible display according to the second embodiment of the present invention has an advantage in that manufacturing expenses can be reduced due to recycling of the carrier substrate since it is separated from the buffer layer, which has the TFT array formed thereon, prior to the scribing process. In addition, this method has an advantage in that manufacturing processes can be simplified since the buffer layer, which has the TFT array formed thereon, is attached to the rear substrate in a simple manner using the adhesive roll, which results in high productivity. Moreover, this method has an advantage in that manufacturing expenses can be reduced by omitting the manufacture of the flexible substrate made of polyimide.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A method of manufacturing a flexible display, comprising:
    forming an adhesive layer on a carrier substrate;
    forming a sacrificial layer directly on the adhesive layer;
    forming a flexible substrate on the sacrificial layer;
    forming a TFT array on the flexible substrate;
    irradiating a laser on to the sacrificial layer to generate hydrogen gas from irradiated portions of the sacrificial layer and to etch the sacrificial layer to separate the flexible substrate from the carrier substrate having the adhesive layer;
    winding the separated flexible substrate having the TFT array formed thereon around an adhesive roll to be attached thereto;
    attaching the flexible substrate, which has been attached to the adhesive roll, to a rear substrate by rolling the adhesive roll;
    forming a display device on the rear substrate; and
    scribing and sealing the attached rear substrate, the sealing including sealing a scribed periphery of the TFT array and the display device with a sealant.

2. The method of claim 1, further comprising: forming a display device on the flexible substrate before separating the flexible substrate from the carrier substrate or after attaching the flexible substrate to the rear substrate.

3. The method of claim 2, wherein the display device is any one selected from the group consisting of an OLED (Organic Light Emitting Diode Display Device), an LCD (Liquid Crystal Display), an EPD (Electrophoretic Display), and a PDP (Plasma Display Panel).

4. The method of claim 1, wherein the adhesive roll is a roller coated with an adhesive.

5. A method of manufacturing a flexible display, comprising:
    forming an adhesive layer on a carrier substrate;
    forming a sacrificial layer directly on the adhesive layer;
    forming a buffer layer on the sacrificial layer;

forming a TFT array on the buffer layer;
irradiating a laser on to the sacrificial layer to generate hydrogen gas from irradiated portions of the sacrificial layer and to etch the sacrificial layer to separate the buffer layer, which has the TFT array formed thereon, from the carrier substrate having the adhesive layer;
winding the separated buffer layer, which has the TFT array formed thereon, around an adhesive roll to be attached thereto;
attaching the buffer layer, which has the TFT array formed thereon and which has been attached to the adhesive roll, to a rear substrate by rolling the adhesive roll;
forming a display device on the rear substrate; and
scribing and sealing the attached rear substrate, the sealing including sealing a scribed periphery of the TFT array and the display device with a sealant.

6. The method of claim 5, further comprising: forming a display device on the rear substrate before separating the buffer layer, which has the TFT array formed thereon, from the carrier substrate, or after attaching the buffer layer, which has the TFT array formed thereon, to the rear substrate.

7. The method of claim 5, wherein the adhesive roll is a roller coated with an adhesive.

8. The method of claim 5, wherein the rear substrate is a flexible substrate.

* * * * *